(12) United States Patent
Boerner et al.

(10) Patent No.: US 8,987,987 B2
(45) Date of Patent: Mar. 24, 2015

(54) ORGANIC ELECTROLUMINESCENT DEVICE

(75) Inventors: Herbert Friedrich Boerner, Aachen (DE); Helga Hummel, Aachen (DE); Claudia Michaela Goldmann, Kreuzau (DE)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 13/879,204

(22) PCT Filed: Oct. 5, 2011

(86) PCT No.: PCT/IB2011/054373
§ 371 (c)(1),
(2), (4) Date: Apr. 12, 2013

(87) PCT Pub. No.: WO2012/052866
PCT Pub. Date: Apr. 26, 2012

(65) Prior Publication Data
US 2013/0293095 A1    Nov. 7, 2013

(30) Foreign Application Priority Data

Oct. 20, 2010  (EP) ..................................... 10188231

(51) Int. Cl.
*H01L 51/52* (2006.01)
*H01L 51/56* (2006.01)
(Continued)

(52) U.S. Cl.
CPC ............ *H05B 33/12* (2013.01); *H01L 51/5231* (2013.01); *H01L 51/5271* (2013.01); *H05B 33/10* (2013.01)
USPC ............................................. 313/504; 445/24

(58) Field of Classification Search
CPC .............. A01B 12/006; H01L 51/5231; H01L 51/5271; H05B 33/10; H05B 33/12
USPC ..................... 313/498–512; 445/24
See application file for complete search history.

(56) References Cited

U.S. PATENT DOCUMENTS

| 7,589,461 B2 | 9/2009 | Park et al. |
| 8,237,158 B2 * | 8/2012 | Chao ............................. 257/40 |

(Continued)

FOREIGN PATENT DOCUMENTS

| JP | 2009245734 A | 10/2009 |
| WO | 2006026618 A1 | 6/2006 |

(Continued)

OTHER PUBLICATIONS

Won Hoe Koo et al; "Light Extraction From Organic Light-Emitting Diodes Enhanced by Spontaneously Formed Buckles", Nature Photinics, vol. 4, Feb. 21, 2010, pp. 222-226, XP002668437.

*Primary Examiner* — Donald Raleigh
(74) *Attorney, Agent, or Firm* — Yuliya Mathis

(57) ABSTRACT

The invention provides an OLED device with improved light out-coupling, which can be manufactured easy and reliable at low costs, which comprises an electroluminescent layer stack (2, 3, 4) on top of a substrate (1), where the electroluminescent layer stack (2, 3, 4) comprises an organic light-emitting layer stack (3) with one or more organic layers sandwiched between a first electrode (2) facing towards the substrate (1) and a 10 second electrode (4), where the second electrode (4) comprises a layer stack of at least a transparent conductive protection layer (41) on top of the organic light-emitting layer stack (3), a transparent organic conductive buckling layer (42) on top of the protection layer (41) having a glass transition temperature lower than the lowest glass transition temperature of the organic layers within the organic light-emitting layer stack (3) and a stress inducing layer 15 (43) on top of the buckling layer (42) to introduce stress to the buckling layer (42). The invention further relates to a method to manufacture such OLED devices with heating the electroluminescent layer (2, 3, 4) stack to a temperature, which is above the glass transition temperature of the buckling layer (42) and below the lowest glass transition temperature of the organic layers within the organic light-emitting layer stack (3) for a time period sufficient 20 to obtain buckles (B) within the buckling layer (42).

20 Claims, 3 Drawing Sheets

(51) Int. Cl.
*H05B 33/12* (2006.01)
*H05B 33/10* (2006.01)

(56) References Cited

U.S. PATENT DOCUMENTS

| | | | |
|---|---|---|---|
| 2004/0061436 A1* | 4/2004 | Ogawa et al. | 313/506 |
| 2005/0184653 A1* | 8/2005 | Suh et al. | 313/504 |
| 2006/0113899 A1* | 6/2006 | Matsumoto et al. | 313/504 |
| 2007/0290607 A1 | 12/2007 | Okada et al. | |
| 2008/0136339 A1* | 6/2008 | Matsuura et al. | 315/169.3 |
| 2009/0051279 A1* | 2/2009 | Mori et al. | 313/504 |
| 2009/0140645 A1* | 6/2009 | Lin et al. | 313/504 |
| 2009/0152533 A1 | 6/2009 | Chan et al. | |
| 2009/0206749 A1* | 8/2009 | Matsudate et al. | 313/505 |
| 2010/0164373 A1* | 7/2010 | Kobayashi | 313/504 |

FOREIGN PATENT DOCUMENTS

| | | |
|---|---|---|
| WO | 2010038005 A2 | 4/2010 |
| WO | 2010064186 A1 | 6/2010 |

* cited by examiner

ORGANIC ELECTROLUMINESCENT DEVICE

FIELD OF THE INVENTION

The invention relates to the field of organic electroluminescent devices with enhanced light out-coupling.

BACKGROUND OF THE INVENTION

Organic electroluminescent devices (or diodes) are devices, where organic molecules emit light when a driving voltage is applied to such organic electroluminescent devices (OLEDs). The OLEDs typically comprise a transparent substrate with an electroluminescent layer stack deposited on top of the substrate comprising an organic light emitting layer stack between two electrode layers, typically a transparent anode on top of the substrate and a reflective cathode on top of the organic layer stack. Since the organic molecules are sensitive to moisture and oxygen, the layer stack is encapsulated by a gastight cover lid sealed on top of the substrate. In order to operate the OLED, driving voltages in the order of a few volts, e.g. 2-15 V are applied.

OLED devices are large area light sources intended for room illumination. However, the mount of light emitted from the OLED devices is only 20% of the amount of light internally generated by the light emitting layer. To increase the efficiency of the OLED devices, an improved light out-coupling is desired. The major loss factor in OLED devices is trapping of the light due to the flat geometry of the OLED device. Typically, only about 50% of the generated light enters the glass substrate and only about 20% escapes into the air. The remaining 50% are trapped in waveguide modes which propagate in the high-index organic layers and the indium-tin-oxide (ITO) electrode. So far, the light trapped in these modes was particularly difficult to be extracted in an economic way. Special substrates with gratings to scatter the trapped light have been used to improve the light out-coupling, where the ITO electrode and the OLED layer stack are deposited on top of such a structure. Such structures will introduce a morphology into the OLED layer stack with decreases the short resistance of the resulting non-flat layer stack compared to OLED devices with a flat OLED layer stack. Structured substrates will additionally increase the manufacturing effort and the manufacturing costs.

Document WO 2010/064186 A1 discloses organic light-emitting device, where the light-reflective layer (electrode on the backside of the OLED device) comprises deformations leading to scattered light enhancing the light out-coupling from the OLED device. These deformations are generated via a laser beam impinging on the rear surface of the light-reflective layer. The laser beam introduces heat to the layer system comprising the organic layers and the reflective layer. When heating the layer stack with this laser beam above the glass transition temperature of the organic layers sandwiched between both electrodes, the whole layer stack forms buckles or wrinkles. The formation of these buckles or wrinkles is driven by the stress in the metal overcoat (reflective layer), which is relieved by wrinkling when the organic layer underneath the reflective layer becomes soft due to heating. These wrinkles are quasi-periodic with a broad periodicity distribution and a directional randomness and act as a type of Bragg grating enhancing the light out-coupling. However, OLED devices treated above the glass transition temperature are mostly shortened, since at the occurring valley bottoms of the wrinkles the distance between cathode and anode is very short leading to high current densities. Sometimes, both electrodes may come into contact directly. Therefore OLED devices treated as described above can only be manufactured with a low production yield and are no reliable over lifetime due to the large probability of occurring shorts. There is a demand to provide an OLED device with improved light out-coupling, which can be manufactured easy and reliable at low costs.

SUMMARY OF THE INVENTION

It is an object of the invention to provide an OLED device with improved light out-coupling, which can be manufactured easy and reliable at low costs.

This object is achieved by an organic electroluminescent device comprising an electroluminescent layer stack on top of a substrate, where the electroluminescent layer stack comprises an organic light-emitting layer stack with one or more organic layers sandwiched between a first electrode facing towards the substrate and a second electrode, where the second electrode comprises a layer stack of at least a transparent conductive protection layer on top of the organic light-emitting layer stack, a transparent organic conductive buckling layer on top of the protection layer having a glass transition temperature lower than the lowest glass transition temperature of the organic layers within the organic light-emitting layer stack and a stress inducing layer on top of the buckling layer to introduce stress to the buckling layer. The OLED device according to the present invention shows a substantially improvement of the light out-coupling, which is independently from the wavelength of the emitted light. Common indium-tin-oxide (ITO) covered glass substrates can still be used to manufacture the OLED device. The present OLED device is a very cheap and reliable solution for improving the light out-coupling for OLED devices without damaging the layer structure within the OLED device. The required manufacturing steps are easily executed.

The buckling layer is deposited as a flat layer on top of the previously deposited layers of the electroluminescent layer stack, which are also prepared as flat layers. Also the stress inducing layer is originally deposited as a flat layer on top of the buckling layer. The buckles within the buckling layer are obtained by utilizing the stress of the stress inducing layer in direct contact with the buckling layer when heating the buckling layer above the glass transition temperature of the buckling layer. Glass transition or vitrification refers to the transformation of a glass-forming liquid into a glass, which usually occurs upon rapid cooling. It is a dynamic phenomenon occurring between two distinct states of matter (liquid and glass), each with different physical properties. Upon cooling through the temperature range of glass transition (a "glass transformation range"), without forming any long-range order or significant symmetry of atomic arrangement, the liquid contracts more continuously at about the same rate as above the melting point until there is a decrease in the thermal expansion coefficient (TEC). The glass transition temperature, $T_g$, is lower than melting temperature. In contrast to viscosity, the thermal expansion, heat capacity, and many other properties of inorganic glasses show a relatively sudden change at the glass transition temperature. The temperature, where this rapid change occurs is denoted as glass transition temperature. As an example, the glass transition temperatures $T_g$ of α-NPD is 95° C., $T_g$ of TPD is 60° C. and $T_g$ of MTDATA is 75° C. In contrast to that, the spiro compounds suitable to be used as hole conducting material have $T_g$>120° C. People skilled in the art may select other organic material with other glass transition temperatures according to their technical knowledge within the scope of this invention. The formation of the buckles within the buckling layer is driven by the relieve of the internal layer stress of the stress inducing layer on top of the buckling layer being soft above the glass transition temperature. A suitable deposition technique for depositing the buckling layer is vacuum evaporation. The induced stress is preferably tensile stress. The relieve of stress results in a wrinkled layer stack of buckling layer and stress inducing layer. The resulting buckles inside the layer stack of buckling layer and stress inducing layer act as a type of Bragg grating scattering back the light from the stress inducing layer. The stress inducing layer is preferably a mirror layer with high reflectivity in order to reflect back as much light as possible. Due to the buckles the back reflection happens under a random angle leading to light entering the substrate surface under in incident angle suitable to be coupled out of the OLED device. The best results are achieved with a buckling structure with an average difference between highest and lowest points within the buckling structure of approximately 10-20 nm. The organic layers of the organic light-emitting layer stack between the electrodes shall remain as flat layers to avoid any shorts between the electrodes. This flat structure is maintained by the applied temperature to introduce buckles into the buckling layer below all of the glass transition temperatures of the organic layers within the organic light-emitting layer stack. Subsequently the morphology between the electrodes remains a flat morphology preventing shorts in comparison to buckled OLEDs heated above the glass transition temperature of the organic light-emitting layer stack. Additionally, the stress induced by the stress inducing layer shall be separated from the organic light-emitting layer stack in order to support the flat morphology of the organic light-emitting layer stack. The protection layer protects the layers deposited between the substrate and the protection layer from the stress induced by the layers deposited on top of the protection layer. The protection layer is deposited by thermal evaporation forming an amorphous, hard and transparent layer without internal stress. The provided OLED device according to the present invention shows an improved light out-coupling due to the random variation of reflection angles for light being reflected back from the stress inducing layer to the substrate. The OLED device can be manufactured easily by applying flat layers with common deposition techniques and the OLED devices work reliable due to the prevention of shorts due to the maintenance of a flat geometry (flat morphology) within the organic light emitting layer stack. The reliable operation avoids production losses due to morphology based shorts and therefore can be manufactured at low costs.

The organic electroluminescent device may utilize organic small molecules or polymers to produce light. Accordingly, OLEDs may be referred to as small molecule organic light emitting devices (SMOLEDs) or polymer light emitting devices (PLEDs). However, SMOLEDS are preferred because of their better light emission performance. OLEDs emitting the light through the substrate are denoted as bottom-emitter. The substrate of bottom emitters is made of a transparent material, e.g. glass or plastic, having two essentially parallel surfaces. OLEDs emitting the light through the side of the OLED opposite to the substrate are denotes as top-emitter. The electroluminescent layer stack comprises at least two electrodes as anode and cathode and an organic light emitting layer stack in between. In some embodiments, there might be a plurality of organic layers arranged between the electrodes, such as hole transport layer, electron transport layer, hole blocking layers, electron blocking layers, one or more light emitting layers, e.g. comprising a host material with embedded light emitting molecules. A large number of different electroluminescent layer stacks comprising a different number/type of layers is known to skilled people, which are able to chose a suitable electroluminescent layer stack in dependence on the desired application. Alternatively organic light-emitting layer stack may comprise only one organic layer able to emit light. In case of bottom-emitters, the electrode deposited on top of the substrate is a transparent anode, e.g. made of indium-tin-oxide (ITO). The OLED device according to the present invention might be a bottom-emitter or a top-emitter. In case of a top-emitter, also the stress inducing layer has to be transparent or semi-transparent. At least a semi-transparent layer which induces the required internal layer stress to the layers underneath could be achieved by a thin metal layer, e.g. an aluminum layer of about 10 nm thickness.

The electroluminescent layer stack is covered by a cover lid in order to prevent moisture or oxygen penetrating into the organic light-emitting layer stack to provide OLEDs with a sufficient life-time. The cover lid is made of any suitable rigid material providing a sufficient barrier against diffusion of moisture and/or oxygen into the encapsulated volume between cover lid and substrate. The cover lid is sealed on top of the substrate by applying a suitable sealing material being sufficiently gas tight, at least against moisture and oxygen, e.g. glass frit (non conductive material) or conductive sealing material (e.g. epoxy glue with conductive filler). The term "sealed on top of the substrate" denotes a tight connection between cover lid and substrate. In case of substrates with additional layers (e.g. contact pads for first and/or second electrodes) on top, the cover lid is sealed to the substrate across theses layers. The cover lid has an inner and outer side, where the inner side denotes the side of the cover lid facing towards the electroluminescent layer stacks. The outer side is correspondingly the other side of the cover lid. The shape of the cover lid is adapted to provide a gap between the inner side of the cover lid and the electroluminescent layer stacks. The gap shall prevent any mechanical impact to the cover lid from the outside of the OLED device reaching the electroluminescent layers. A getter material might be arranged inside the gap, typically attached to the inner side of the cover lid. The gap between cover lid and electroluminescent layer stack could have dimensions up to a few millimeters. Typically the gap is filled with gas, e.g. dry nitrogen. Alternatively the gap might be filled with dry ambient air.

In the present invention, the term "conductive" always denotes an electrically conductive material or component, even if the term "electrically" is not used.

In an embodiment the stress inducing layer is a metal layer, preferably an aluminum layer. Metal layers prepared with evaporation or sputtering are able to induce the required stress, preferably a tensile stress, at low layer thicknesses. As a preferred material, aluminum spontaneously forms the desired buckles when heating the buckling layer above the glass transition temperature. To obtain the desired buckles, the thickness of the stress inducing layers is larger than 5 nm, preferably below 50 nm, more preferably between 10 nm and 25 nm. If the stress inducing layer is too thick, the buckling behavior is not sufficient. If the stress inducing layer is too thin, the induced stress is too low to buckle the buckling layer. The stress inducing layer is preferably deposited by vacuum evaporation to provide the require stress induced to the second electrode.

In another embodiment the protection layer is made of a metal oxide, preferably made of $MoO_3$, $WO_3$, $V_2O_5$ or a mixture of these materials. These materials are able to prevent the organic light-emitting layer from being affected by the stress induced to the second electrode layer stack. In another embodiment the protection layer has a thickness larger than 20 nm, preferably larger than 40 nm, more preferably larger than 60 nm. Protection layer with such layer thicknesses are able to prevent the organic light-emitting layer from being affected by the stress induced to the second electrode layer stack. The required thickness for the protection layer depends on the strength of the induced stress. Furthermore a certain minimum thickness of the electrically conductive protection layer helps to equalize the varying lateral conductivity within the buckling layer due to the buckled structure in order to keep the current injection into the organic light-emitting layer stack as homogeneous as possible.

In another embodiment the buckling layer has a glass transition temperature of at least 30° C. below the lowest glass transition temperature of the organic layers within the organic light-emitting layer stack. A difference between the glass transition temperatures of the buckling layer and the other organic layers within the electroluminescent layer stack are required to maintain a flat morphology of the organic light-emitting layer stack. A difference of at least 30° C. will prevent any negative effect on the present geometry of the organic light-emitting layer stack during relieve of stress during heating the buckling layer above its glass transition temperature. As an example, common organic materials for OLED devices such as α-NPD with $T_g=95°$ C. is applicable within the organic light-emitting layer stack in case of a buckling layer made of TPD with $T_g=60°$ C. Also spiro compounds with $T_g>120°$ C. can be used as hole conducting material within the organic light-emitting layer stack.

In another embodiment the buckling layer comprise a suitable amount of conductive material doped to the buckling layer in order to enhance the electrical conductivity of the buckling layer. An increased conductivity of the buckling layer will support a more homogeneous current distribution over the second electrode. The doping of the buckling layer can be performed in the same way as doping the organic layers within the organic light-emitting layer stack. The common n- and p-dopants for organic light-emitting material can be used also for the buckling layer. As an example, α-NPD or TPD might be doped with dopants of a amount varying between 0.1% to 10%.

In another embodiment the buckling layer has a layer thickness of more than 20 nm, preferably a thickness below 150 nm, more preferably a thickness between 50 nm and 100 nm. The out-coupling behavior showed the best results with a difference between highest and lowest points within the bucked structure of 10-20 nm. The layer thickness subsequently should be larger than 20 nm. A too thick buckling layer will not show the required buckling behavior, therefore the layer thickness of the buckling layer should be lower than 150 nm.

In another embodiment the second electrode further comprises a stress enhancement layer deposited on top of the stress inducing layer having a larger internal stress than the stress inducing layer. If the stress induced by the stress inducing layer is not sufficient to obtain the required buckling behavior (e.g. a certain periodicity or a certain difference between highest and lowest point within the buckling structure), the stress can be enhanced by an additional layer, the stress enhancement layer. In a preferred embodiment the stress enhancement layer is a metal layer made of Mn, Cu, Cr or mixtures thereof. The stress enhancement layer might be deposited by vacuum evaporation to provide the required stress properties.

In another embodiment a current distribution layer is deposited on top of the second electrode, preferably made of aluminum or copper. The current distribution layer is electrically conductive and has a sheet resistance lower than the buckling layer and the protection layer. The current distribution layer supports the current distribution additionally and provides an OLED device emitting light with a more homogeneous brightness. Preferred materials for the current distribution layer are aluminum and copper due to their good electrical conductivity and the corresponding low sheet resistance.

The invention further relates to a method to manufacture an organic electroluminescent device according to the present invention comprising the step of depositing the second electrode comprising a layer stack of at least a transparent conductive protection layer, a transparent organic conductive buckling layer and a stress inducing layer, on top of the organic light-emitting layer stack, and heating the electroluminescent layer stack to a temperature, which is above the glass transition temperature of the buckling layer and below the lowest glass transition temperature of the organic layers within the organic light-emitting layer stack for a time period sufficient to obtain buckles within the buckling layer, preferably the time period is between 20 sec and 40 sec. The advantage of the method according to the present invention is the applicability of the majority of the common manufacturing steps for providing OLED devices. The additionally required manufacturing steps for depositing the second electrode as a layer stack to realize the present invention are easily executed. The material deposition of the layers of the second electrode can be performed for example by evaporation. The heating can be executed by placing the OLED in an oven and heating the oven to the desired temperature.

In another embodiment the method further comprises the step of stamping the buckling layer with a pre-shaped buckling tool during the heating step in order to introduce buckles into the buckling layer, preferably with a buckling tool made of silicone or rubber. The temperature above the glass transition temperature of the buckling layer provides a soft buckling layer, which can be shaped with the buckling tool or in addition to the stress relive with the buckling tools. The buckling tool has to comprise the desired buckled surface in order to stamp (or print) the desired buckling structure into the buckling layer. The buckling tool may be a stencil or a stamp made of silicon or rubber in order to prevent any damage to the layer underneath the buckling layer. Again the protection layer provides enough mechanical protection for the layer underneath to enable a soft stamping of the buckling structure. The stencil or stamp might be manufactured in the same way as e.g. holographic maters for security holograms are made. Alternatively, a buckling process can be used itself to manufacture the master. The advantage of embossing (stamping) of the second electrode is the predetermined pattern of the buckles.

In another embodiment the method comprises the step of depositing a stress enhancement layer on top of the stress inducing layer before heating the electroluminescent layer stack. In another embodiment the method further comprises the step of thickening the second electrode by depositing a current distribution layer on top of the second electrode after the heating step. The deposited current distribution layer shall maintain the buckled structure in order to maintain the improved light out-coupling of the OLED device according to the present invention.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
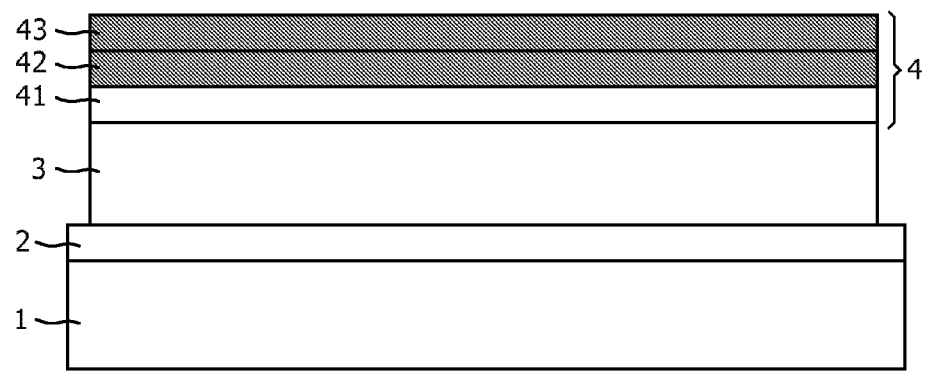
FIG. 1: an embodiment of an OLED in accordance to the present invention.

FIG. 1 shows an embodiment of an OLED in accordance to the present invention, where the organic electroluminescent device comprising an electroluminescent layer stack 2, 3, 4 on top of a substrate 1, where the electroluminescent layer stack 2, 3, 4 comprises an organic light-emitting layer stack 3 with one or more organic layers sandwiched between a first electrode 2 facing towards the substrate 1 and a second electrode 4. The second electrode 4 comprises a layer stack of at least a transparent conductive protection layer 41 on top of the organic light-emitting layer stack 3, a transparent organic conductive buckling layer 42 on top of the protection layer 41 having a glass transition temperature lower than the lowest glass transition temperature of the organic layers within the organic light-emitting layer stack 3 and a stress inducing layer 43 on top of the buckling layer 42 to introduce stress to the buckling layer 42. The second electrode still has a flat geometry after being deposited. The stress of the aluminum layer as the stress inducing layer with a thickness of 10 nm induced to the buckling layer 42 with a thickness of 75 nm is not sufficient at temperatures below the glass transition temperature Tg of the buckling layer 42, e.g. at room temperature, to introduce buckles B. Explicit examples of OLED device structures in accordance to the present invention are given in the examples A and B, where the terms OLE layer stack and CDL denote the organic light-emitting layer stack 3 and the current distribution layer. "d" denotes the layer thickness of the particular layer.

Example A

| Layer | material | d (nm) | $T_g$ (° C.) |
| --- | --- | --- | --- |
| Substrate 1 | glass | | non-organic |
| First electrode 2 | ITO | 100 | non-organic |
| OLE layer stack 3 | Spiro-TAD:F4-TCNQ 2% | 30 | 133 |
| | Spiro-TAD | 10 | 133 |
| | Spiro.TAD:Ir(mdq)2 acac 9% | 30 | 133 |
| | Bis-OXD | 10 | 147 |
| | Bis-OXD:W$_2$(hpp)$_4$ 5% | 10 | 147 |
| Protection layer 41 | WO$_3$ | 60 | non-organic |
| Buckling layer 42 | α-NPD:F4-TCNQ | 25 | 95 |
| Stress inducing layer | Al | 20 | non-organic |
| CDL (optional) | Al (or Co) | 80 | non-organic |

In example A, $T_g$ of the buckling layer is 38° C. lower than the lowest $T_g$ of the organic-light-emitting layer stack.

Example B

| Layer | material | d (nm) | $T_g$ (° C.) |
| --- | --- | --- | --- |
| Substrate 1 | glass | | non-organic |
| First electrode 2 | ITO | 100 | non-organic |
| OLE layer stack 3 | Spiro-TAD:F4-TCNQ 2% | 30 | 133 |
| | Spiro-TAD | 10 | 133 |
| | Spiro.TAD:Ir(mdq)2 acac 9% | 30 | 133 |
| | Bis-OXD | 10 | 147 |
| | Bis-OXD:W$_2$(hpp)$_4$ 5% | 10 | 147 |
| Protection layer 41 | WO$_3$ | 60 | non-organic |
| Buckling layer 42 | TPD:F4-TCNQ | 25 | 60 |
| Stress inducing layer | Al | 20 | non-organic |
| CDL (optional) | Al (or Co) | 80 | non-organic |

In this example B, $T_g$ of the buckling layer is 73° C. lower than the lowest $T_g$ of the organic-light-emitting layer stack.

Figure 2:
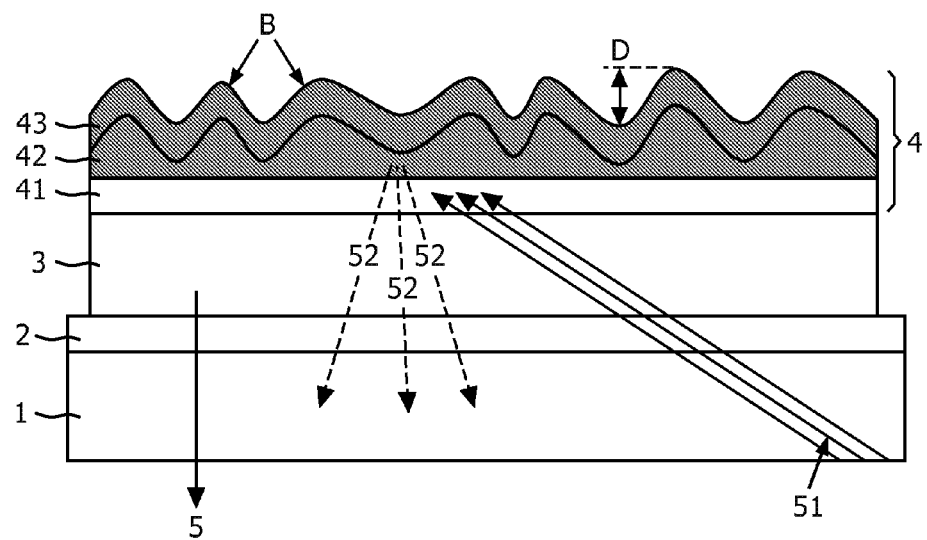
FIG. 2: the OLED of FIG. 1 after the heating step with a buckling structure.

In the examples A and B, Bis-OXD denotes 4,4'-bis(5-phenyl-[1,3,4]oxadiazol-2-yl)-2,2'-dinaphthylbiphenyl and (hpp) denotes the anion of 1,3,4,6,7,8-hexahydro-2H-pyrimido[1,2-c]pyrimidine. As an alternative for the protection layer, MoO$_3$ or V$_2$O$_5$ could be used in these examples instead of WO$_3$ FIG. 2. shows the OLED device after applying the step of heating the electroluminescent layer 2, 3, 4 stack to a temperature, which is above the glass transition temperature Tg of the buckling layer 42 and below the lowest glass transition temperature of the organic layers within the organic light-emitting layer stack 3 for a time period of 30 sec to obtain buckles B within the buckling layer 42 with a difference D between highest and lowest point within the buckling structure of 15 nm. The WO$_3$ layer as the protection layer 41 with a thickness of 50 nm prevents the organic light-emitting layer 3 underneath the WO$_3$ layer from being affected by the buckling of the buckling layer 41. In case of other applied materials and/or other thicknesses of the layers of the second electrode the induced stress might be not sufficient to obtain the desired buckling structure. An additional stress enhancement layer (not shown here) deposited on top of the stress inducing layer 43 having a larger internal stress than the stress inducing layer 43 can be used to adjust the required stress induced to the buckling layer 42. Suitable materials for the stress enhancement layer are for example Mn, Cu, Cr or mixtures thereof. The propagation direction of emitted light is indicated in FIG. 2 by some exemplary examples. The emission within the organic light-emitting layer 3 is in principle isotropic. The light 5 with a propagation direction approximately perpendicular to the surface of the transparent substrate 1 will lead the OLED device directly. Light entering the surface at higher incident angles might be reflected back from the surface of the substrate 1. Such light 51 may enter the second electrode layer 4 at a certain incident angle and will be reflected back from the surface of the buckling structure 42 in contact with the reflective stress inducing aluminum layer 43 with a random angle distribution in dependence on the location, where the light 51 enters the surface of the buckling structure. Therefore only a very limited number of reflections of light back and forth are needed to provide a propagation direction for the reflected light entering the surface of the substrate at an incident angle sufficient for leaving the OLED device.

Figure 3:
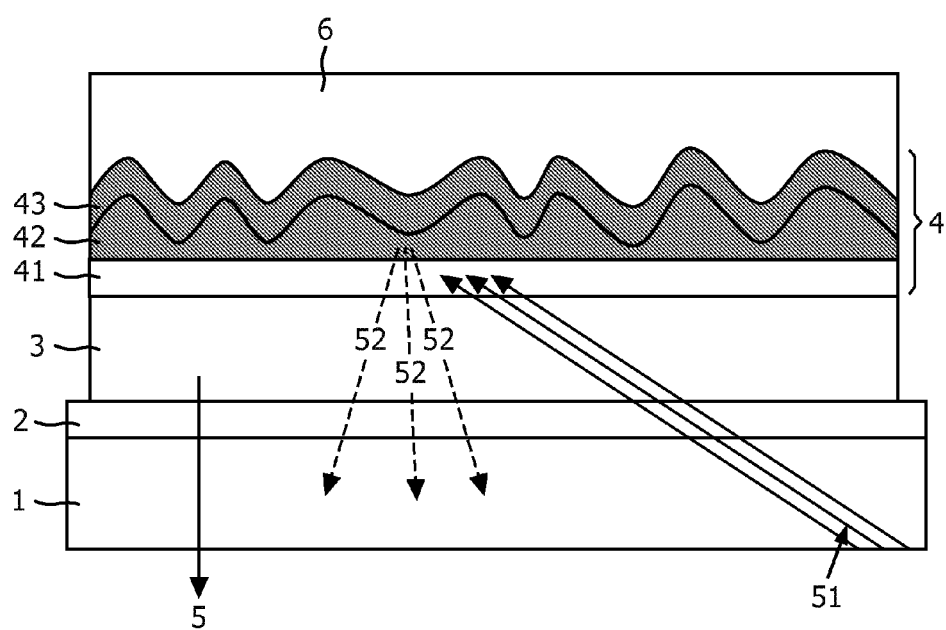
FIG. 3: another embodiment of an OLED in accordance to the present invention further comprising a current distribution layer on top of the second electrode.

FIG. 3 shows another embodiment of an OLED device in accordance to the present invention, where the OLED devices from FIG. 2 further comprising a current distribution layer 6 on top of the second electrode 4. The current distribution layer 6 is electrically conductive and has a sheet resistance much lower than the buckling layer 42 and the protection layer 41. The current distribution layer 6 supports the current distribution additionally and provides an OLED device emitting light with a more homogeneous brightness. Preferred materials for the current distribution layer 6 are aluminum and copper due to their good electrical conductivity and the corresponding low sheet resistance. The stress inducing layer 43 may also be made of aluminum, however the very thin stress inducing layer of 10 nm thickness has not the same conductivity properties as a thick aluminum layer (e.g. with thicknesses of 100 nm) as the current distribution layer 6. The effect for the light 51 remains the same as shown in FIG. 2.

Figure 4:
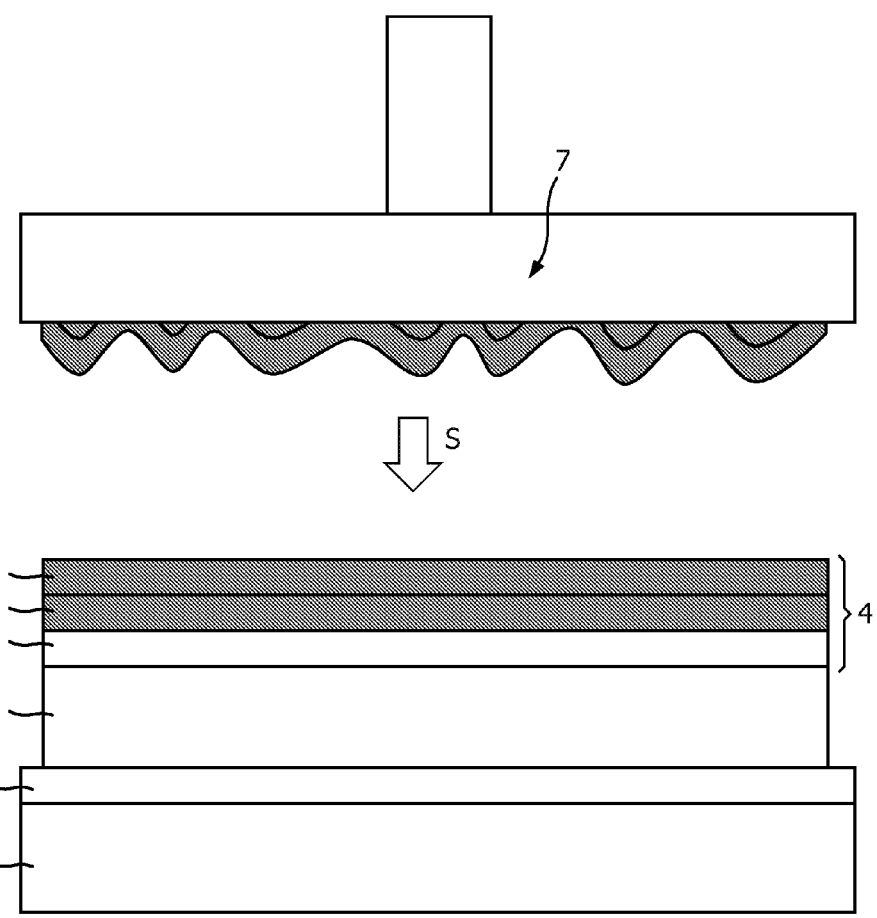
FIG. 4: another embodiment of an OLED device in accordance to the present invention, where the buckles are embossed or stamped into the buckling layer.

FIG. 4 shows another embodiment of an OLED device in accordance to the present invention, where the buckles B are embossed or stamped into the buckling layer 42 with a buckling tool 7. The step of stamping S the buckling layer 42 with a pre-shaped buckling tool 7 is executed during the heating of the OLED device above the glass transition temperature of the buckling layer 42, e.g. in an oven. The temperature above the glass transition temperature of the buckling layer 42 provides a soft buckling layer 42, which can be shaped with the buckling tool 7 or in addition to the stress relive with the buckling tools 7. The buckling tool 7 has to comprise the desired buckled surface in order to stamp S (or print) the desired buckles B into the buckling layer 42. The buckling tool 7 may be a stencil or a stamp made of silicon in order to prevent any damage to the layers 2 and 3 underneath the buckling layer 42. Again the protection layer 41 provides enough mechanical protection for the layers 2 and 3 underneath to enable a soft stamping of the buckling structure. The stencil or stamp might be manufactured in the same way as e.g. holographic maters for security holograms are made. Alternatively, a buckling process can be used itself to manufacture the master. The advantage of embossing (stamping) of the second electrode 4 is the predetermined pattern of the buckles B. Here the second electrode 4 might be thickened after providing the buckling structure in the same manner as shown in FIG. 3.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF REFERENCE SIGNS

1 substrate
2 first electrode
3 organic light-emitting layer stack
4 second electrode
41 protection layer
42 buckling layer
43 stress inducing layer
5 directly emitted light
51 light reflected back from the substrate surface
52 light randomly reflected back from the buckling structure
6 current distribution layer
7 buckling tool
B buckles
D distance between the highest and the lowest pint within the buckling structure
S embossing or stamping the buckles into the buckling layer

The invention claimed is:

1. An organic electroluminescent device comprising an electroluminescent layer stack on top of a substrate, where the electroluminescent layer stack comprises an organic light-emitting layer stack with one or more organic layers sandwiched between a first electrode facing towards the substrate and a second electrode, where the second electrode comprises a layer stack of at least a transparent conductive protection layer on top of the organic light-emitting layer stack, a transparent organic conductive buckling layer disposed on top of the transparent conductive protection layer, the transparent organic conductive buckling layer having a glass transition temperature lower than the lowest glass transition temperature of the organic layers within the organic light-emitting layer stack, and a reflective stress inducing layer on top of the buckling layer to introduce stress to the buckling layer.

2. The organic electroluminescent device as claimed in claim 1, wherein the stress inducing layer is an aluminum layer.

3. The organic electroluminescent device as claimed in claim 2, wherein the stress inducing layer has a thickness larger than 5 nm.

4. The organic electroluminescent device as claimed in claim 2, wherein the protection layer comprises a metal oxide.

5. The organic electroluminescent device as claimed in claim 2, wherein the protection layer has a thickness larger than 20 nm.

6. The organic electroluminescent device as claimed in claim 2, wherein the buckling layer has a glass transition temperature which is at least 30° C. less than the lowest glass transition temperature of the organic layers within the organic light-emitting layer stack.

7. The organic electroluminescent device as claimed in claim 2 wherein the buckling layer comprises a suitable amount of conductive material doped to the buckling layer in order to enhance the electrical conductivity of the buckling layer.

8. The organic electroluminescent device as claimed in claim 2 wherein the buckling layer has a layer thickness of more than 20 nm.

9. The organic electroluminescent device as claimed in claim 2, wherein the second electrode further comprises a stress enhancement layer deposited on top of the stress inducing layer having a larger internal stress than the stress inducing layer.

10. The organic electroluminescent device as claimed in claim 9, wherein the stress enhancement layer is a metal layer made of Mn, Cu, Cr or mixtures thereof.

11. The organic electroluminescent device as claimed in claim 10, wherein a current distribution layer is deposited on top of the second electrode, and wherein the current distribution layer comprises aluminum or copper.

12. A method to manufacture an organic electroluminescent device as claimed in claim 1, comprising:
depositing the second electrode comprising a layer stack of at least a transparent conductive protection layer, a transparent organic conductive buckling layer and a stress inducing layer, on top of the organic light-emitting layer stack, and heating the electroluminescent layer stack to a temperature, which is above the glass transition temperature of the buckling layer and below the lowest glass transition temperature of the organic layers within the organic light-emitting layer stack for a time period sufficient to obtain buckles within the buckling layer.

13. The method as claimed in claim 12, further comprising the step of stamping the buckling layer with a pre-shaped buckling tool during the heating step in order to introduce buckles into the buckling layer.

14. The method as claimed in claim 12, further comprising the step of depositing a stress enhancement layer on top of the stress inducing layer before heating the electroluminescent layer stack.

15. The method as claimed in claim 14, further comprising the step of thickening the second electrode by depositing a current distribution layer on top of the second electrode after the heating step.

16. The organic electroluminescent device as claimed in claim 2, wherein the stress inducing layer has a thickness between 10 nm and 25 nm.

17. The organic electroluminescent device as claimed in claim 2, wherein the buckling layer has a layer thickness between 50 nm and 100 nm.

18. A device, comprising:
a first electrode disposed on a substrate;
an organic light-emitting layer stack disposed on the first electrode, wherein the organic light-emitting layer stack includes one or more organic layers; and
a second electrode disposed on the organic light-emitting layer stack, wherein the second electrode comprises:
a transparent conductive protection layer disposed on the organic light-emitting layer stack,
a transparent organic conductive buckling layer disposed on the protection layer, wherein the transparent organic conductive buckling layer has a plurality of buckles formed therein and has a glass transition temperature which is less than the lowest glass transition temperature of the organic layers within the organic light-emitting layer stack, and
a stress inducing layer disposed on the buckling layer.

19. The device of claim 18, wherein the buckling layer has a glass transition temperature that is at least 30° C. less than the lowest glass transition temperature of the organic layers within the organic light-emitting layer stack.

20. The device of claim 18, further comprising a current distribution layer disposed on the second electrode, wherein the current distribution layer comprises aluminum or copper.

* * * * *